United States Patent
Popovici et al.

(10) Patent No.: US 9,558,305 B1
(45) Date of Patent: Jan. 31, 2017

(54) AUTOMATIC MODELING, MAPPING, AND CODE GENERATION FOR HOMOGENEOUS AND HETEROGENEOUS PLATFORMS

(75) Inventors: Katalin M. Popovici, Natick, MA (US); Ramamurthy Mani, Wayland, MA (US); Hidayet Tunc Simsek, Newton, MA (US); Zhihong Zhao, Newton, MA (US); Rajiv Ghosh-Roy, Hudson, MA (US)

(73) Assignee: The MathWorks, Inc., Natick, MA (US)

( * ) Notice: Subject to any disclaimer, the term of this patent is extended or adjusted under 35 U.S.C. 154(b) by 1048 days.

(21) Appl. No.: 13/485,839

(22) Filed: May 31, 2012

(51) Int. Cl.
| | | |
|---|---|---|
| G06F 17/50 | (2006.01) | |
| G06G 7/62 | (2006.01) | |
| G06F 9/45 | (2006.01) | |
| G06G 7/48 | (2006.01) | |

(52) U.S. Cl.
CPC ....... G06F 17/5022 (2013.01); G06F 17/5027 (2013.01); *G06F 17/5095* (2013.01)

(58) Field of Classification Search
CPC .............. G06F 17/5009; G06F 17/5018; G06F 17/5095; H04L 41/5003; H04L 41/0836
USPC .......................................... 703/7, 13–15, 22
See application file for complete search history.

(56) References Cited

U.S. PATENT DOCUMENTS

| | | | | |
|---|---|---|---|---|
| 7,596,636 | B2* | 9/2009 | Gormley | 710/8 |
| 2006/0200795 | A1* | 9/2006 | MacLay | G06F 9/455 |
| | | | | 717/106 |
| 2008/0313600 | A1* | 12/2008 | Moore | 717/104 |
| 2010/0312364 | A1* | 12/2010 | Eryilmaz et al. | 700/30 |

OTHER PUBLICATIONS

Hillenbrand et al., "An approach to supply simulations of the functional environment of ECUs for hardware-in-the-loop test systems based on EE-architectures conform to AUTOSAR.", 2009, IEEE/IFIP International Symposium on Rapid System Protyping. IEEE, pp. 188-195.*

* cited by examiner

*Primary Examiner* — Aniss Chad
(74) *Attorney, Agent, or Firm* — Harrity & Harrity, LLP

(57) ABSTRACT

In an embodiment, a system may receive information regarding a group of physical devices; receive information regarding a set of functional blocks associated with a functional model; and receive mapping information that indicates a mapping between the set of functional blocks and one or more physical devices of the group of physical devices. The system may further generate at least one functional effect associated with the functional model. The generating may be based on: the set of functional blocks, the mapping information, and the information regarding the one or more physical devices. The system may also store or output the at least one functional effect.

21 Claims, 11 Drawing Sheets

AUTOMATIC MODELING, MAPPING, AND CODE GENERATION FOR HOMOGENEOUS AND HETEROGENEOUS PLATFORMS

BACKGROUND

Technical computing environments are known that present a user, such as a scientist or engineer, with an environment that enables efficient analysis and generation of technical applications. For example, users may perform analyses, visualize data, and develop algorithms. Technical computing environments may allow a technical researcher or designer to efficiently and quickly perform tasks, such as research and product development.

Existing technical computing environments may be implemented as or run in conjunction with a graphically-based environment. For example, in one existing technical computing environment that is run in conjunction with a graphically-based environment, graphical simulation tools allow models to be built by connecting graphical blocks, where each block may represent an object associated with functionality and/or data.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements. Also, the following detailed description does not limit the invention.

In modeling a system in a graphical modeling environment (GME), the system to be modeled may include a system, such as a distributed embedded system or a parallel computing system, that includes one or more physical devices. In a distributed embedded system, one or more physical devices may have a defined role and may perform different tasks from other physical devices. These physical devices may include processing devices, input devices, and/or output devices. A parallel computing system may include multiple processing devices packaged as a unit in which a task may be separated into smaller tasks that can be run in parallel on the multiple processing devices.

Different types of processing devices may have their own distinct advantages and/or disadvantages. For example, field programmable gate arrays (FPGAs) may be associated with high performance and relatively low cost. As another example, processors (e.g., central processing units (CPUs)) may be associated with high flexibility and availability. Because of these various advantages, it may be advantageous for different processing devices to perform different tasks, such as executing separate portions of a functional model. Thus, certain systems may include multiple different types of processing devices, which may each execute portions of a functional model.

Different types of input or output devices may have their own distinct advantages and/or disadvantages. For example, serial communication devices (e.g., serial communication interface (SCI)) devices may be associated with slow data transfer. As another example, parallel input/output devices (e.g., small computer system interface (SCSI)) may be associated with high flexibility in terms of data transfer. Because of these various advantages, it may be advantageous for different input or output devices to perform different data transfers, such as executing separate data of a functional model. Thus, certain systems may include multiple different types of input/output devices, which may each execute portions of a functional model.

Functional models generated with graphical modeling tools may be simulated on a host computer or converted to computer code by the graphical modeling tool. The computer code may be executed in the target platform environment. Graphical modeling tools may allow the user to separately specify an architectural model of the physical system. A final, executable version of the functional model may be based on a mapping between the functional model and the architectural model.

Overview

Figure 1:
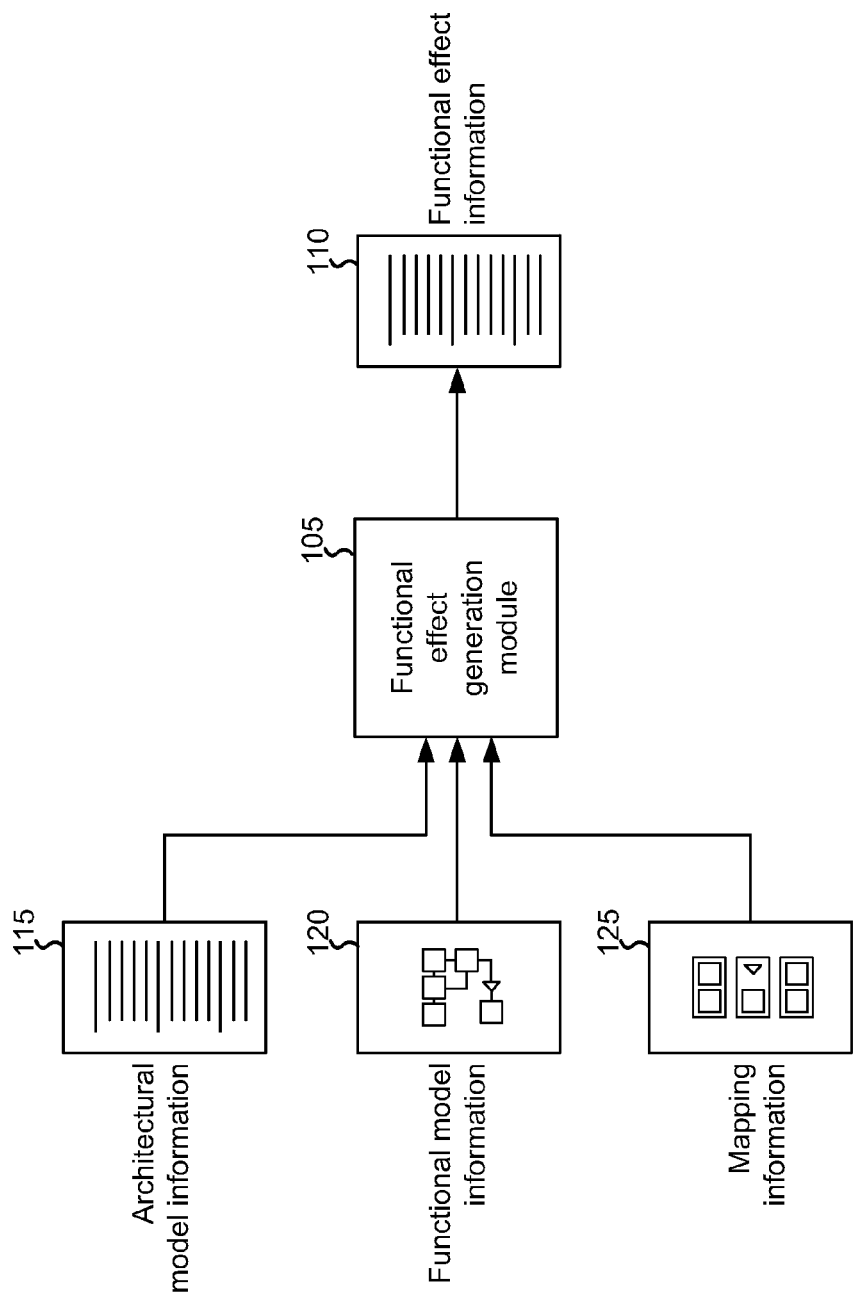
FIG. 1 illustrates an example overview according to one or more implementations described herein.

Implementations described herein relate to a graphical modeling environment (GME). The GME may be a part of, or may incorporate, a technical computing environment (TCE). As shown in FIG. 1, a GME may include a functional generation effect module 105. Functional effect generation module 105 may generate functional effect information 110 based on an architectural model (e.g., architectural model information 115), a functional model (e.g., functional model information 120), and/or a mapping between the functional model and the architectural model (e.g., mapping information 125).

Architectural model information 115 may include information regarding one or more physical resources with which the functional model may be associated. These physical resources may include, for example, processing devices, input/output devices, communication pathways between these processing devices, and/or communication pathways between the processing devices and input/output devices. Examples of various processing devices and input/output devices are discussed below. Functional model information 120 may include information indicating a functional model that defines a desired algorithm that is to be implemented. Mapping information 125 may include information identifying a mapping between the functional model (e.g. the functional model indicated by functional model information 120) and one or more physical resources identified by architectural model information 115. The mapping may be from the functional model to one or more physical resources and/or from the one or more physical resources to the functional model.

Functional effect generation module 105 may generate functional effect information 110 based on the functional model, the information regarding the physical resources, and the mapping of the functional model to the one or more of the physical resources. For example, functional effect generation module 105 may generate functional effect information 110 based on types of processing devices indicated by architectural model information 115, types of input/output devices indicated by architectural model information 115, device drivers associated with the processing devices indicated by architectural model information 115, etc. In some implementations, functional effect information 110 may be obtained, for example, by generating compiled code (e.g., machine-executable code) from the mapped functional model, generating un-compiled code (e.g., code that is not executable by a machine without further processing) from the mapped functional model, etc. In some such implementations, the code may be based on the functional model and the physical devices to which the functional model is mapped. For instance, the code may include device driver code (and/or references to device driver code and/or libraries) associated with the physical devices to which the functional model is mapped.

An example of functional effect generation may include determining communication delay between two connected blocks of the functional model, which are mapped to different physical devices, based on the configuration of the physical devices, such as execution mode. For instance, assuming that one of the physical devices is configured as delayed coprocessor, delay may be associated with data transferred from this device to the other physical device. The GME may use the determined communication delay in simulation of the mapped functional model.

In some implementations, the GME may allow for multiple different mappings of a particular functional model to a particular set of physical devices and associated communication pathways. In some implementations, the GME may allow for multiple different mappings of a particular functional model to multiple sets of physical devices and associated communication pathways. The GME may allow for simulation of mapped functional models by, for example, simulating execution of the mapped models on the physical devices and communication pathways. In order to simulate execution, the GME may, for example, simulate communication delay, processing speed, scheduler, and/or other factors associated with the physical devices and communication pathways. In some implementations, such information may be obtained from architectural model information 115.

Thus, the GME, according to some implementations, may allow a user to identify a satisfactory mapping, for example, an optimal mapping, of a functional model to a particular architecture. Further, in some implementations, the GME may allow a user to identify a satisfactory architecture, for example, an optimal architecture, onto which to map a functional model. Once a mapping and/or an architecture is selected, the generated code may be provided to a system that includes the architecture, so that the system may execute the generated code according to the selected mapping.

DEFINITIONS

A processing device, as used herein, may refer to any hardware device that performs processing functionality. A processing device may include a processing device of any type, such as, for example, a CPU, an FPGA, an application specific integrated circuit (ASIC), a floating point unit (FPU), a graphics processing unit (GPU), a multi-core processor, a particular set of cores of a multi-core processor, an electronic control unit (ECU)—e.g., an ECU in accordance with the AUTOSAR architecture and/or any other type of ECU—a digital signal processor (DSP), a microcontroller unit, and/or any other type of processing device.

An input/output device, as used herein, may refer to any hardware device that performs external communication functionality. An input/output device may include an input/output device of any type, such as, for example, a SCI, a SCSI, an analog to digital (A/D) converter, a digital to analog (D/A) converter, a Radio Frequency (RF) transceiver, Universal Serial Bus (USB), Ethernet, and/or any other type of input/output device.

A physical device, as used herein, may refer to any processing device or input/output device.

A communication channel, as used herein, may refer to any methodology by which one processing device may communicate, either uni-directionally or bi-directionally, with one or more other processing devices. Examples of a communication channel may include a general purpose network, shared memory access, a physical bus or an access protocol, which may implement Controller Area Networks (CAN), Ethernet, Transmission Control Protocol/Internet Protocol (TCP/IP), etc.

A communication pathway, as used herein, may refer to any methodology by which one processing device may communicate, either uni-directionally or bi-directionally, with one or more processing or input/devices devices through one or multiple communication channels.

A target platform, as used herein, may be defined as a computing system in which multiple processing devices communicate over one or more communication paths to execute a task. The platform may be homogeneous if the processing devices are of the same type, or heterogeneous if the processing devices are different types. The target platform may send or receive data from another platform using input/output devices. Distributed embedded systems, including, for example, middleware architectures of AUTOSAR Run-Time Environment, CORBA Components and OMG's Data Distribution Services, and task parallel computing systems are examples of target platforms.

A functional model, as used herein, may refer to a model that implements algorithmic elements specified by, for example, a user. Generally, the functional model may be created without regard to implementation details of the physical system that is to implement the model. A functional model may include, for example, any equations, assignments, constraints, computations, algorithms, and/or process flows. The functional model may be implemented as, for example, time-based block diagrams (e.g., via the Simulink® product, available from The MathWorks, Incorporated), discrete-event based diagrams (e.g., via the SimEvents® product, available from The MathWorks, Incorporated), dataflow diagrams, state transition diagram (e.g., via the Stateflow® product, available from The MathWorks, Incorporated), software diagrams, a textual array-based and/or dynamically typed language (e.g., via the MATLAB® product, available from The MathWorks, Incorporated), and/or any other type of functional model. Functional models may be used in many different applications. For example, a functional model may represent a control process for a vehicle in which the model controls certain components of the vehicle based on input received from sensors in the vehicle. As another example, a model may be used to control various stations in an industrial assembly line. It can be appreciated that these two model examples are not limiting, and in general, a graphical model can be used to implement any number of systems, processes, or algorithms.

An architectural model, as used herein, may refer to a target platform in which the functional model is to be implemented. The architectural model may describe capabilities of the physical system, such as its computational resources, including, for instance, types of processing and/or input/output devices, driver information associated with the processing devices in the system, performance information associated with the processing devices and/or communication pathways in the system, a quantity of processing and/or input/output devices, a quantity of communication pathways in the system, and/or any other information associated with the architectural model. The architectural model may, in some implementations, indicate memory resources and additional physical devices for which the functional model will be implemented. Consideration of the details of the physical system with respect to the requirements of the algorithmic elements in the functional model may be resolved as part of a mapping of the functional model to the architectural model.

The various models described herein may be generated via a GME. The GME may incorporate, or be part of, a TCE that may include any hardware and/or software based logic that provides a computing environment that allows users to perform tasks related to disciplines, such as, but not limited to, mathematics, science, engineering, medicine, business, etc.

The GME may further provide mathematical functions and/or graphical tools or functional blocks (e.g., for creating plots, surfaces, images, volumetric representations, etc.). In an implementation, the GME may provide these functions and/or tools using toolboxes (e.g., toolboxes for signal processing, image processing, data plotting, parallel processing, etc.). In another implementation, the GME may provide these functions as block sets. In still another implementation, the GME may provide these functions in another way, such as via a library, etc.

The GME may implement an environment that provides for the graphical creation of models that are defined by users to implement desired functionality. Certain aspects of the GME, as it relates to the creation of models, will be described in more detail below.

System Description

Figure 2:
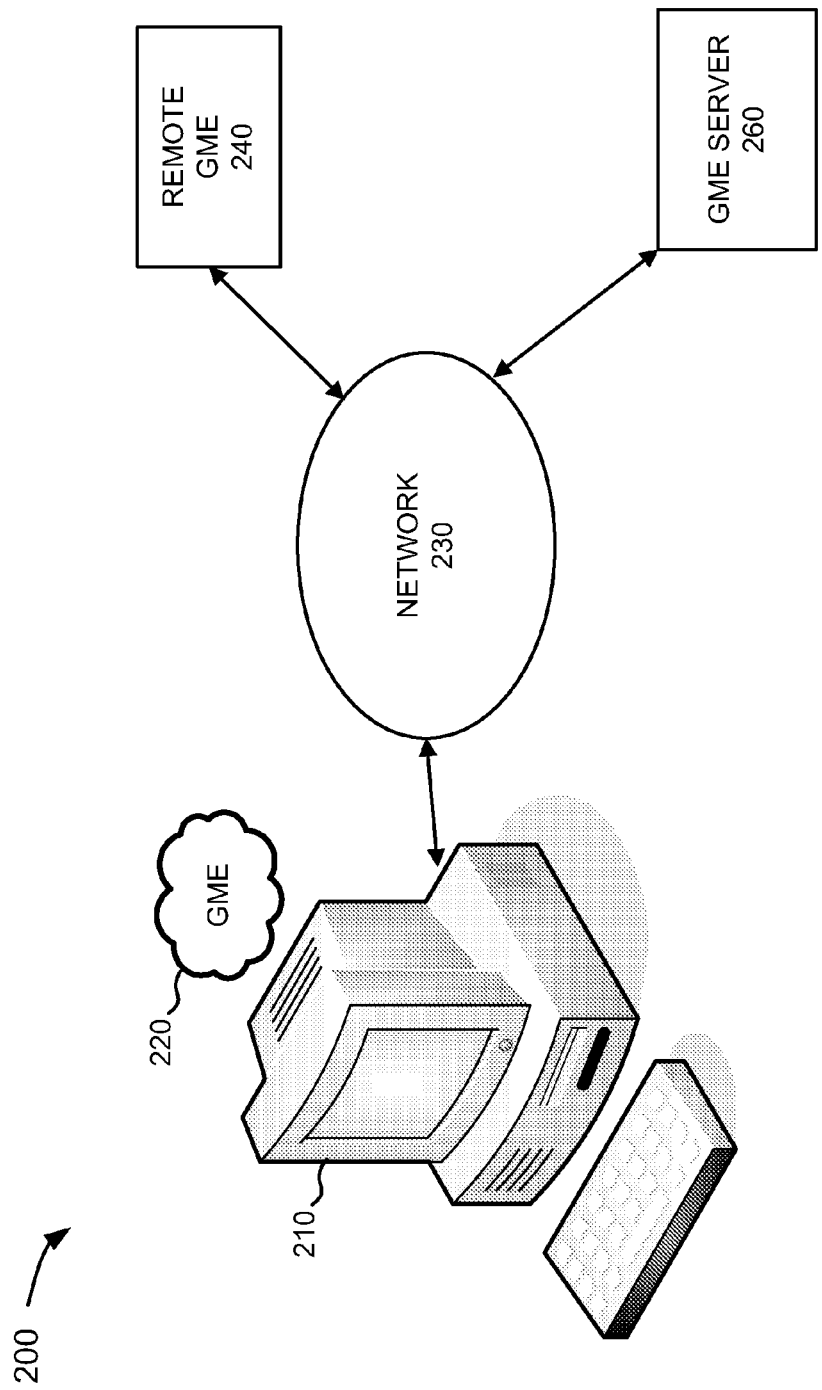
FIG. 2 illustrates an example system in which concepts described herein may be implemented.

FIG. 2 is an example diagram of a system 200 in which concepts described herein may be implemented. The system may include workstation 210 (e.g., a computing device, such as a personal computer, a server device, or the like). Workstation 210 may execute GME 220, which may present an interface that enables efficient analysis and generation of technical applications. For example, GME 220 may provide a numerical and/or symbolic computing environment that allows for matrix manipulation, plotting of functions and data, implementation of algorithms, creation of user interfaces, and/or interfacing with programs in other languages.

In some implementations, workstation 210 may operate as a single detached computing device. In some implementations, workstation 210 may be connected to a network 230, such as a local area network (LAN) or wide area network (WAN), such as the Internet. When workstation 210 is connected to a network, GME 220 may be run by multiple networked computing devices or by one or more remote computing devices. In such an implementation, GME 220 may be executed in a distributed manner, such as by executing on multiple computing devices simultaneously (e.g., GME 220 may be implemented, at least partially, using a "cloud" architecture). Additionally, in some implementations, GME 220 may be executed over network 230 in a client-server relationship. For example, workstation 210 may act as a client that communicates with, using a web browser, a server that stores and potentially executes the GME program.

For example, as shown in FIG. 2, system 200 may include remote GME 240 (e.g., a remotely located computing device running a GME) and/or GME server 260. GME server 260 may include a server computing device that provides a GME as a remote service. For instance, a GME may be provided as a web service. The web service may provide access to one or more programs provided by GME server 260.

Although FIG. 2 shows example components of system 200, in other implementations, system 200 may contain fewer, different, or additional components than depicted in FIG. 2. In still other implementations, one or more components of system 200 may perform one or more tasks performed by one or more other components of system 200.

Figure 3:
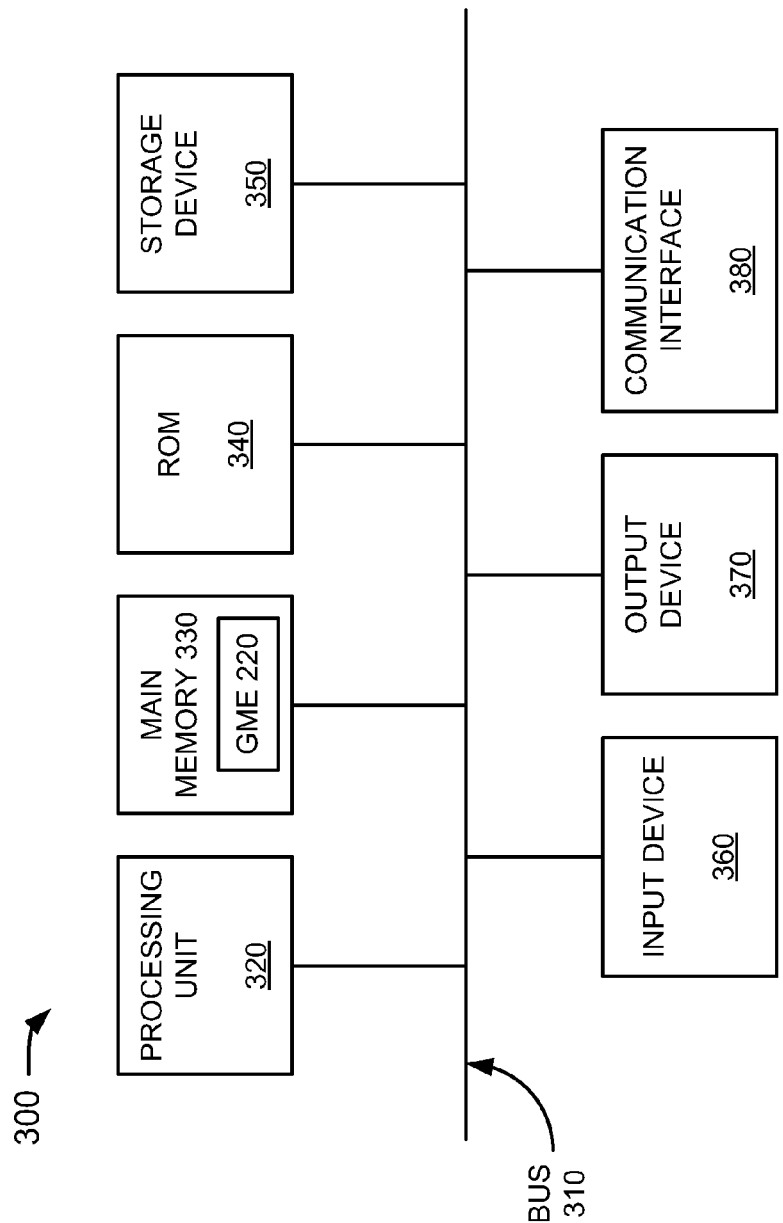
FIG. 3 illustrates an example device corresponding to a workstation or a remote device running a remote graphical modeling environment (GME) or GME service.

FIG. 3 illustrates an example device 300. Device 300 may correspond to, for example, workstation 210, a remote device running remote GME 240, and/or GME server 260. As illustrated, workstation 210 may include a bus 310, a processing unit 320, a main memory 330, a read-only memory (ROM) 340, a storage device 350, an input device 360, an output device 370, and/or a communication interface 380. Bus 310 may include a path that permits communication among the components of device 300.

Processing unit 320 may include a processor, microprocessor, or other types of processing logic that may interpret and execute instructions. Main memory 330 may include a random access memory (RAM) and/or another type of dynamic storage device that may store information and instructions for execution by processing unit 320. ROM 340 may include a ROM device or another type of static storage device that may store static information and/or instructions for use by processing unit 320. Storage device 350 may include a solid state, magnetic, and/or optical recording medium and its corresponding drive.

Input device 360 may include a mechanism that permits an operator to input information to device 300, such as a keyboard, a mouse, a pen, a single- or multi-point interface such as a touchpad, a microphone, a camera, an accelerometer, gyroscope, a neural interface, voice recognition and/or biometric mechanisms, etc. Output device 370 may include a mechanism that outputs information to the operator, including a display, a printer, a speaker, etc. Communication interface 380 may include any transceiver-like mechanism that enables device 300 to communicate with other devices and/or systems. For example, communication interface 380 may include mechanisms for communicating with another device or system via a network, such as network 230.

As will be described in detail below, device 300 may perform certain operations in response to processing unit 320 executing software instructions contained in a computer-readable medium, such as main memory 330. For instance, device 300 may implement GME 220 by executing software instructions from main memory 330. A computer-readable medium may be defined as a non-transitory memory device. A memory device may include space within a single physical memory device or spread across multiple physical memory devices. The software instructions may be read into main memory 330 from another computer-readable medium, such as storage device 350, or from another device via communication interface 380. The software instructions stored in main memory 330 may cause processing unit 320 to perform processes that will be described later. Alternatively, hardwired circuitry may be used in place of or in combination with software instructions to implement processes described herein. Thus, implementations described herein are not limited to any specific combination of hardware circuitry and software.

Although FIG. 3 shows example components of device 300, in other implementations, device 300 may contain fewer, different, or additional components than depicted in FIG. 3. In still other implementations, one or more components of device 300 may perform one or more tasks performed by one or more other components of device 300.

Example Process

Figure 4:
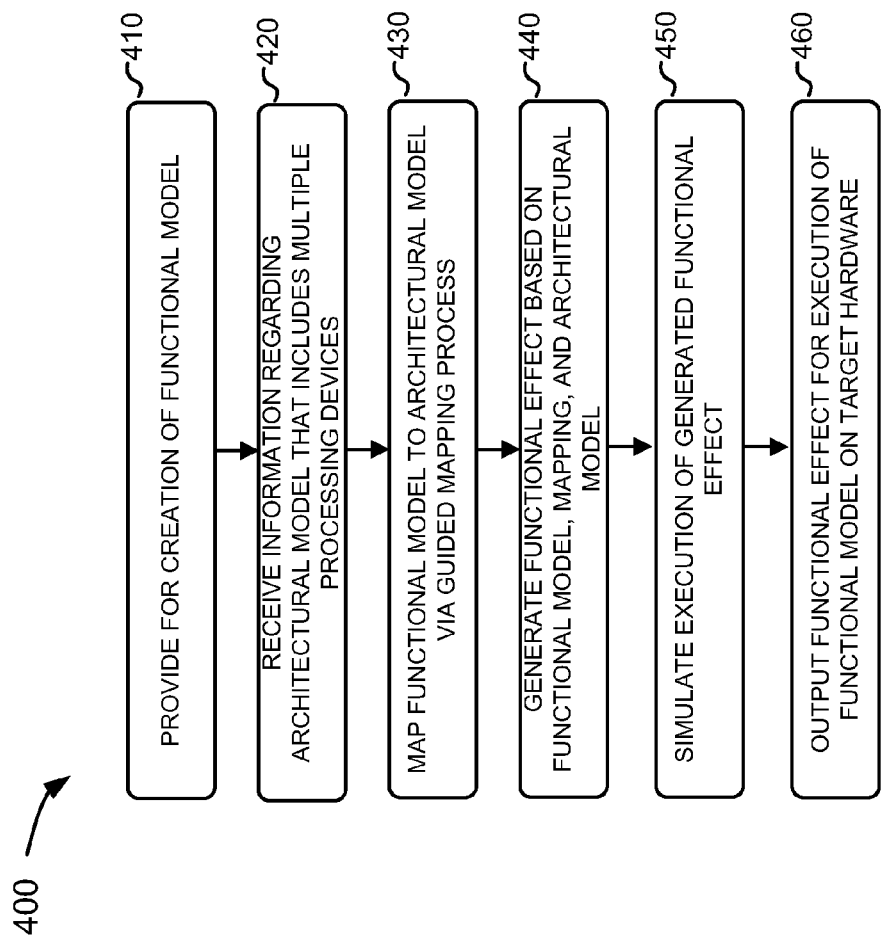
FIG. 4 illustrates an example process for generating functional effects based on physical device information, functional model information, and mapping information.

FIG. 4 illustrates an example process 400 for creating functional effects for a functional model on a platform. In some implementations, process 400 may be performed by one or more devices implementing GME 220 (e.g., by processing unit 320 executing one or more instructions stored by main memory 330). In some implementations, some or all of process 400 may be performed by one or more other components instead of, or possibly in conjunction with, GME 220.

Process 400 may include providing for the creation of a functional model (block 410). GME 220 may, for example, provide one or more graphical interfaces through which a user can arrange graphical blocks that represent functionality and/or data. A graphical block may itself be defined using one or more graphical blocks to create model sub-systems. At some level of the hierarchical structuring of sub-system blocks, blocks may be defined via computer code. Users of GME 220 may obtain blocks that define different functions by using, for example, blocks written by a manufacturer of GME 220, from third parties, or by defining their own custom blocks. In alternative implementations, the functional model may be represented as, for example, a state transition diagram.

Figure 5:
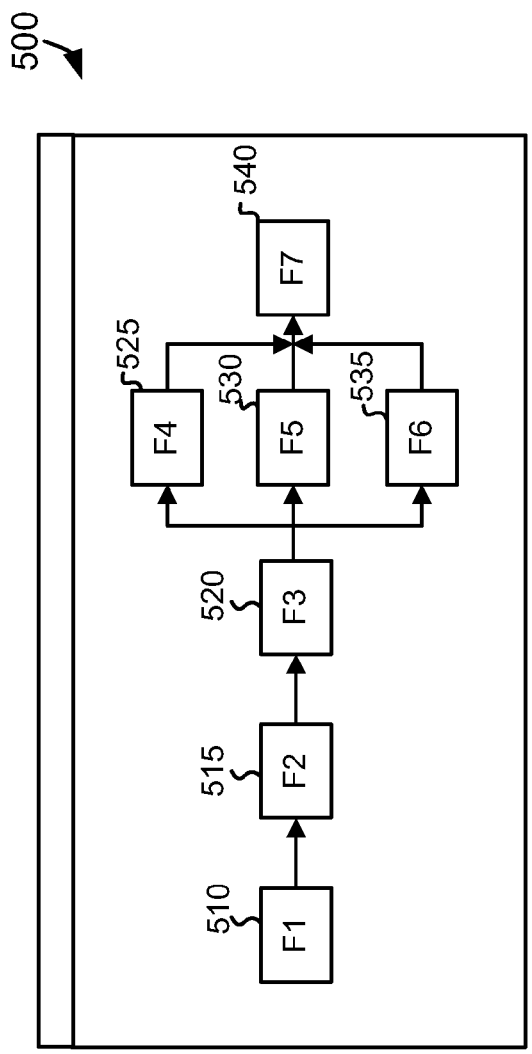
FIG. 5 illustrates an example functional model.

FIG. 5 illustrates example functional model 500. As shown, functional model 500 includes seven blocks, including blocks F1 510, F2 515, F3 520, F4 525, F5 530, F6 535, and F7 540. Each block 510-540 may represent functionality and/or data (e.g., a source or destination of data). For instance, block F1 may represent input from a network or sensor, blocks F2 and F3 may represent sequential processing that is performed on the sensor data, blocks F4, F5, and F6 may represent different functions that are independently performed on the output of block F3, and block F7 may be an output block. Lines between the blocks may represent data flow or, more generally, block connectivity (e.g., as equations). GME 220 may provide an interface through which users can add, remove, and modify blocks 510-540. In some implementations, GME 220 may provide a number of block libraries, for example, organized by technical discipline, through which users can select blocks and add the selected blocks to a model.

Returning to FIG. 4, process 400 may further include receiving information regarding an architectural model that includes multiple processing and input/output devices (block 420). For example, GME 220 may receive information (e.g., in the form of one or more files, and/or via some other technique) regarding target hardware (e.g., a set of processing devices and/or communication pathways through which the processing devices may communicate). Additionally, or alternatively, GME 220 may provide one or more graphical interfaces through which a user can arrange graphical blocks that represent functionality of the platform on which functional model 410 is to be deployed.

The information regarding the architectural model may identify, for example, one or more types of processing devices included in the target hardware. As discussed above, these types of devices may include, for example, CPUs, GPUs, FPUs, FPGAs, ASICs, ECUs, multi-core processors, particular cores or sets of cores of multi-core processors, and/or any other type of processing device. The information regarding the architectural model may include, in some implementations, information identifying properties associated with the processing devices. These properties may include, for example, clock speed information, scheduler type information, information relating types of connections between processing devices, throughput capability information, processing capability information, and/or any other type of properties.

The information regarding the architectural model may identify, for example, one or more types of input/output devices included in the target hardware. As discussed above, these types of devices may include, for example, SCI, SCSI, A/D, D/A, RF transceiver, USB, Ethernet and/or any other type of input/output device. The information regarding the architectural model may include, in some implementations, information identifying properties associated with the input/output devices. These properties may include, for example, throughput capability information, data processing capability information, and/or any other type of properties.

The information regarding the architectural model may, in some implementations, include device driver information associate with the processing devices. The device driver information may include, for instance, code, references to code, one or more libraries, and/or references to one or more libraries. The device driver information for a particular processing device may, for example, be based on the type of processing device and a code language that may be associated with a functional model that may be mapped to the processing device. For example, device driver information for a particular CPU may include information regarding one device driver for the particular CPU and the C programming language, and another device driver for the particular CPU and the Java programming language. The device driver information may, in some implementations, specify how to include device driver code into code that is generated based on the functional model and the architectural model (e.g., the information may specify points in the generated code at which to insert the device driver code). The information regarding the architectural model may, in some implementations, include information regarding one or more communication channels (e.g., one or more physical uni-directional or bi-directional connections) between processing devices in the target hardware. The information regarding the architectural model may, in some implementations, include ECU information, such as, for example, received from an AUTOSAR ECU Extract.

In some implementations, GME 220 may provide, for display, some or all of the information received at block 420. For instance, GME may provide for display, via a graphical interface, information identifying processing devices specified in the architectural model, properties of the processing devices, etc. In some implementations, GME 220 may allow for manipulation of some or all of the received information. For example, GME 220 may allow a user to add, remove, or modify processing devices from the architectural model. Additionally, or alternatively, GME 220 may allow a user to add, remove, or modify properties associated with processing devices specified by the architectural model. GME 220 may store version information associated with such changes, so a user may view different versions of the architectural model, and may quickly see the differences between different versions of the architectural model.

In some implementations, GME 220 may receive (at block 420) information regarding multiple architectural models. In these implementations, a user may select and/or modify a particular architectural model, out of the multiple architectural models. For instance, GME 220 may display, via a user interface, graphical information (e.g., text, icons, etc.) that represents multiple architectural models. A user may, in some implementations, select a particular architectural model by, for example, selecting (e.g., single clicking, double-clicking, highlighting, etc.) the graphical information that represents the particular architectural model.

Figure 6A:
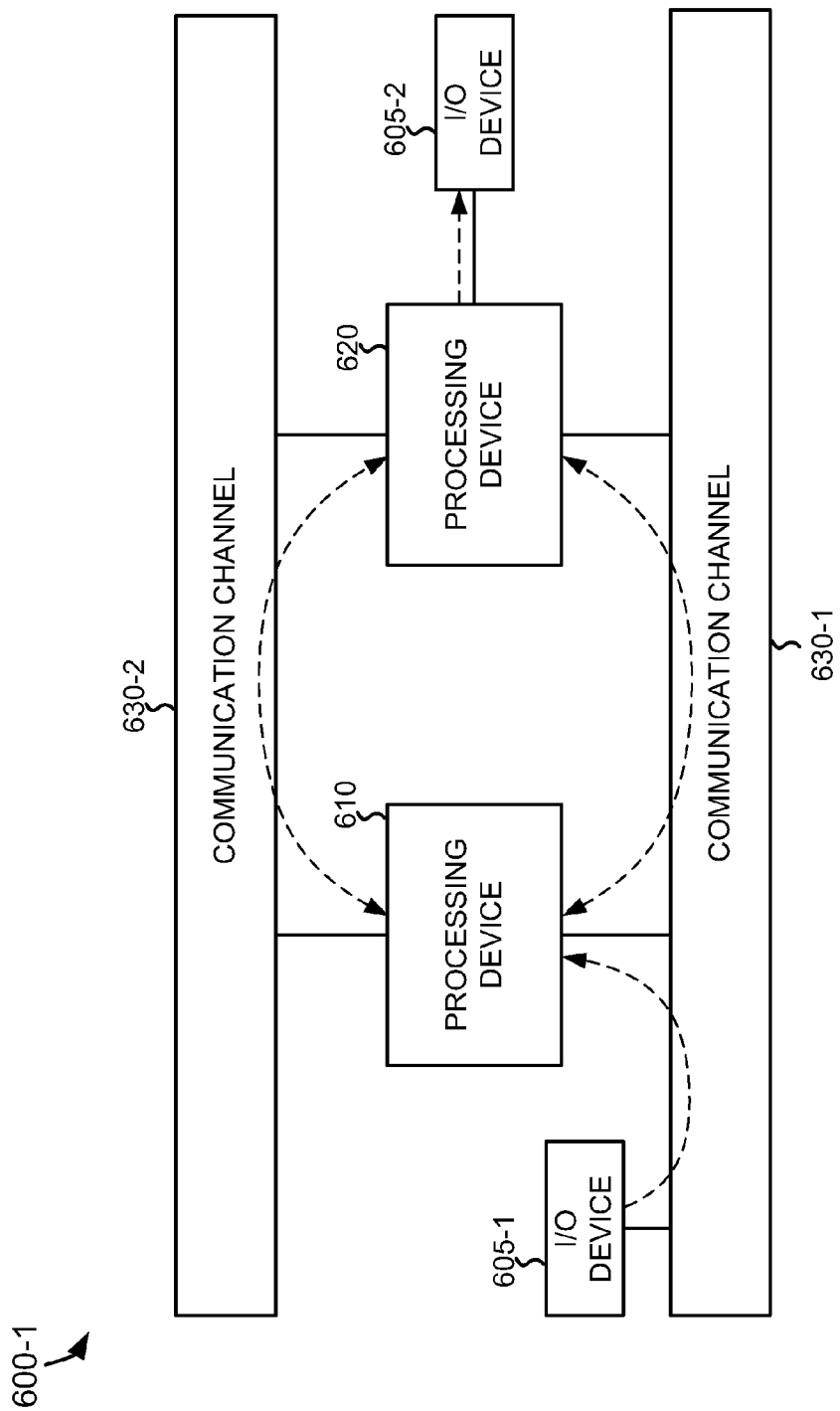
FIGS. 6A-6D illustrate example architectural models.

FIG. 6A illustrates an example architectural model 600-1. As shown in FIG. 6A, model 600-1 may represent a system that includes two processing devices and two input/output devices. In particular, model 600-1 may include two input/output devices 605-1 and 605-2, two processing devices 610 and 620, and two communication channels 630-1 and 630-2, each of which may be represented by a corresponding graphical block. Communication channels 630-1 and/or 630-2 may model the behavior of two communication channels that connect input/output devices 605-1 and 605-2 and processing devices 610 and 620. For example, as shown, communication channel 630-1 may model the behavior of a communication channel that connects input/output device 605-1 to processing device 610, and connects processing device 610 to processing device 620. As also shown, communication channel 630-2 may model the behavior of a communication channel that connects processing device 610 to processing device 620. As discussed in the FIGS. 6B-6D, processing devices 610 and 620 may include any type of processing devices.

Figure 6B:
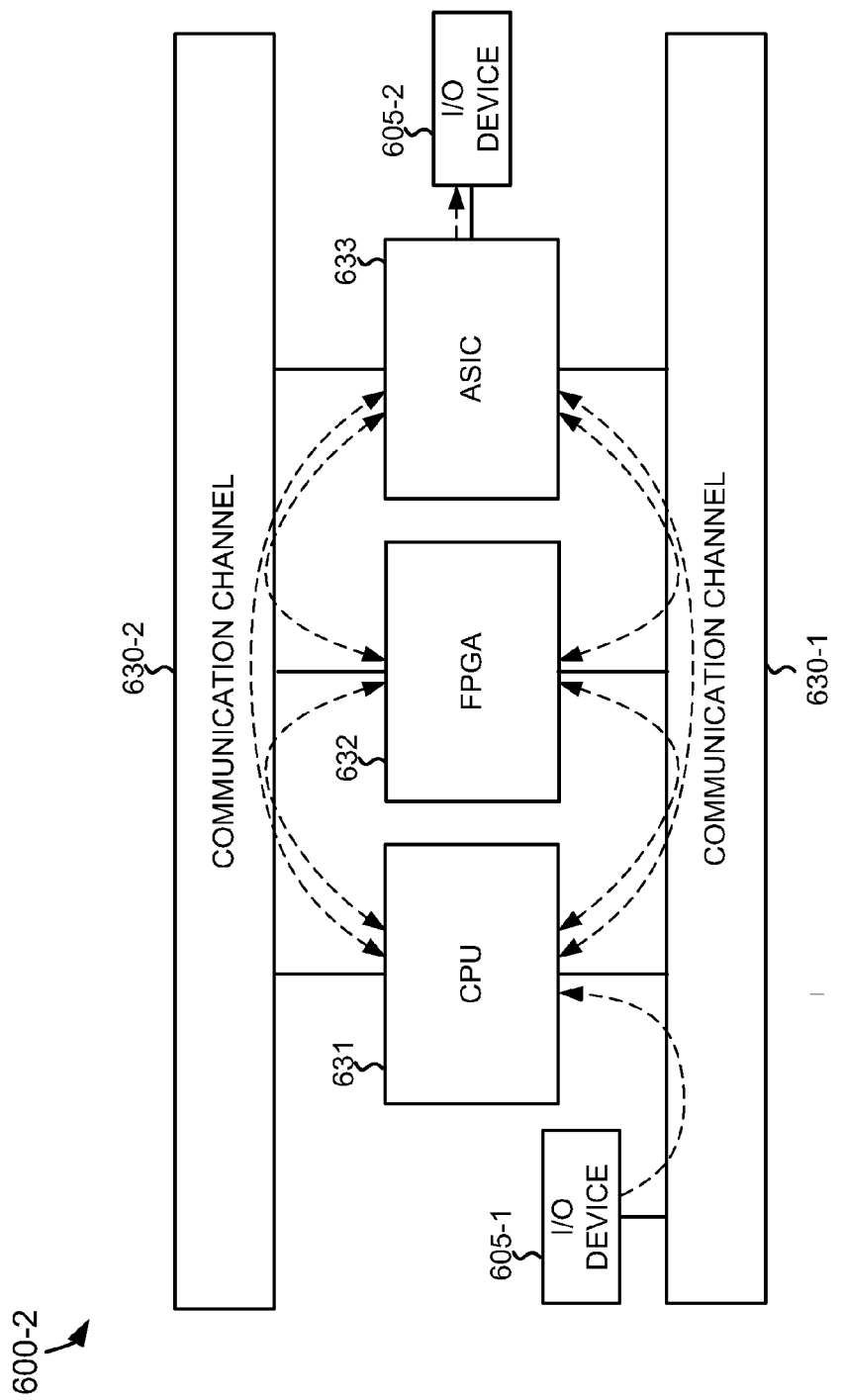

FIG. 6B illustrates another example architectural model 600-2, which may include multiple different types of processing devices. As shown in FIG. 6B, model 600-2 may represent a system that includes three processing devices and two input/output devices. In particular, model 600-2 may include two input/output devices 605-1 and 605-2, three processing devices—CPU 631, FPGA 632, and ASIC 633—and communication channels 630-1 and 630-2, each of which may be represented by a corresponding graphical block.

Figure 6C:
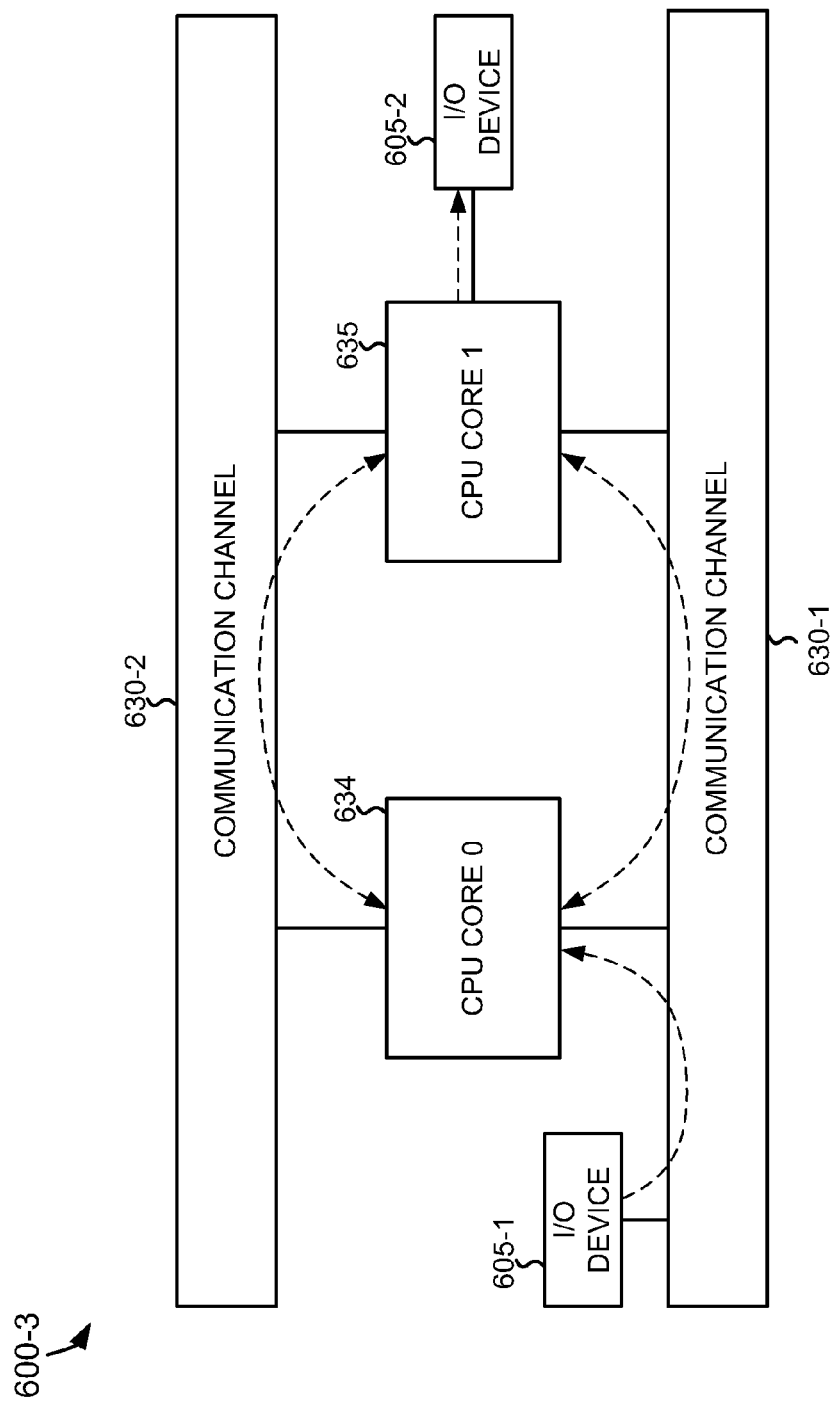

FIG. 6C illustrates another example architectural model 600-3, which may include multiple different processing devices. As shown in FIG. 6C, model 600-3 may represent a system that includes two cores of a multi-core processor and two input/output devices. In particular, model 600-3 may include two input/output devices 605-1 and 605-2, two processing devices—CPU core 0 (634) and CPU core 1 (635)—and communication channels 630-1 and 630-2, each of which may be represented by a corresponding graphical block. Communication channels 630-1 and 630-2 may, for example, represent communication channels within the multi-core processor, through which CPU cores 634 and 635 may communicate. As is apparent from FIG. 6C, some systems may include multiple processing devices of the same type.

Figure 6D:
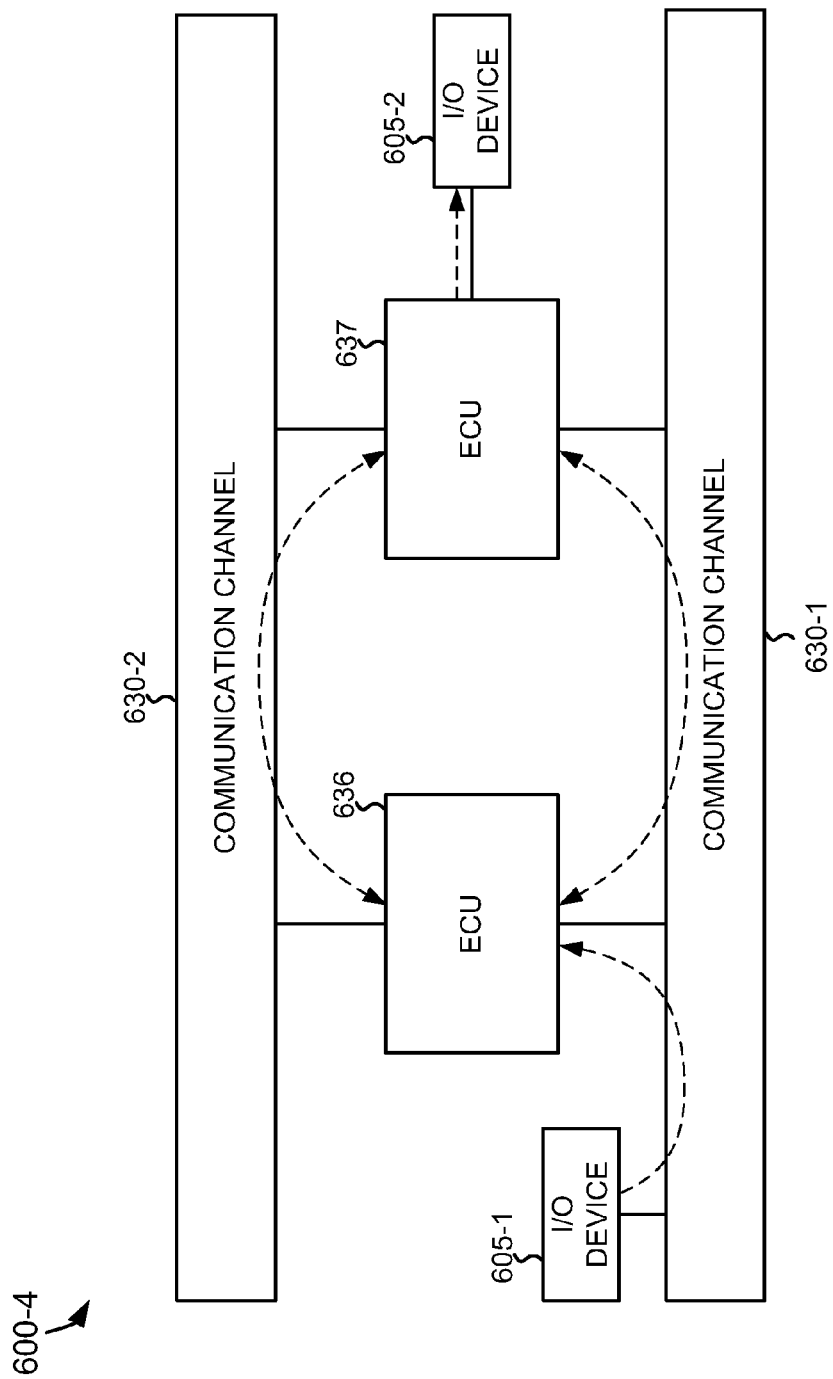

FIG. 6D illustrates another example architectural model 600-4, which may include multiple different processing devices. As shown in FIG. 6D, model 600-4 may represent a system that includes two input/output devices, two ECUs (e.g., ECUs that conform to the AUTOSAR architecture and/or any other type of ECUs). In particular, model 600-4 may include two input/output devices 605-1 and 605-2, two processing devices—ECU 636 and ECU 637—and communication channels 630-1 and 630-2, each of which may be represented by a corresponding graphical block. As is also apparent from FIG. 6D, some systems may include multiple processing devices of the same type.

Communication channel 630 may be associated with (e.g., include) one or more channel functional blocks that describe the behavior of the channel. The blocks that define communication channel 630 may relate to, for instance, model properties of channel 630, such as the bandwidth of the channel, an error rate of the channel (e.g., bit error rate (BER) or packet error rate (PER)), the latency of the channel, or other properties relating to the channel. A model of channel 630 may be designed to be a model of an expected implementation of channel 630, such as, for example, a network connection, a direct physical connection (e.g., a serial bus), or a shared memory connection.

Returning to FIG. 4, process 400 may include mapping the functional model to the architectural model via a guided mapping process (block 430). By using a guided mapping process, GME 220 may provide an optimal, a suboptimal (e.g., based on a cost function with weighed criteria and a tolerance), and/or a satisfactory mapping. Mapping the functional model to the architectural model may involve assigning functional units (e.g., blocks) in functional model 500 to the processing devices and/or the communication channel in the architectural model (e.g., architectural models 600-1 through 600-4, and/or any other architectural model). In some implementations, the mapping of the functional model to the architectural model may be performed automatically by GME 220 or semi-automatically in which the user may guide GME 220 in mapping the functional units to the architectural model.

When automatically or semi-automatically mapping the functional model to the architectural model, GME 220 may use algorithmic blocks of the processing devices and communication channel(s) to optimize assignment of functional units to processing devices. For example, if a communication channel, such as channel 630, has a low bandwidth, functional blocks that have a high inter-block data connection may tend to be mapped to the same processing devices. In other implementations, the mapping may be performed manually, in which, for example, a user may map functional units to processing devices in architectural model 500.

In some implementations, a mapping may at least in part be based on general directives. For example, a mapping may direct that a functional block be mapped onto a DSP without providing a particular DSP of an architectural model that the functional model is mapped onto. When an architectural model is selected, GME 220 may determine whether a DSP is part of the architectural model and map the functional block to this particular DSP. Mapping directives may include type of processing devices, characteristics of processing devices (e.g., fixed point vs. floating point), connection patterns (e.g., processing devices with direct memory access), etc.

As part of the mapping process, certain properties of the functional blocks may be reconfigured or partially reconfigured in order to meet various algorithmic requirements of functionality with respect to capabilities and resources provided by hardware and/or other architectural elements. For example, as part of the mapping, fixed-point data types may be reconfigured to make use of available word-sizes on target hardware. As another example, values of certain closed-loop gains may be readjusted to account for delays which may be incurred as a result of communication from one processing device to another.

Various properties of the functional blocks may be partially specified. Here, GME 220 may infer (e.g., propagate), complete, and select the partially specified properties (e.g., sample times, data types, whether a variable has an imaginary part, and dimensions). Partially specified properties may be completed based on hardware and other architectural resources available. For example, GME 220 may select data types of block outputs to be the largest possible word size for accuracy or the smallest possible word size based on memory optimization settings.

In some implementations, GME 220 may utilize properties associated with the architectural model (e.g., information received at block 420) when performing the guided mapping process. For instance, GME 220 may identify clock speeds, communication latency, hardware size (e.g., area), power consumption, etc. associated with processing devices and communication channels, and may generate an optimal mapping based on this information. GME 220 may receive optimization goals from a user in order to determine the optimal or a suboptimal (e.g., optimal within a tolerance of a cost function that weighs the optimization goals) mapping. For instance, the optimization goals may specify that the optimization should be for speed, power consumption, hardware size, any combination of these factors, and/or any other factors.

In some implementations, GME 220 may evaluate multiple candidate mappings and/or architectures in parallel. For example, assume that GME 220 receives a functional model and an architectural model. GME 220 may utilize properties associated with the architectural model to simultaneously evaluate multiple different candidate mappings associated with the architectural model and the functional model (e.g., in response to a single command from a user to map the functional model to the architecture).

In some implementations, GME 220 may automatically identify hardware architecture optimization options. For example, when performing the mapping process, GME 220 may identify portions of the functional model that may be performed more optimally (e.g., according to specified criteria, such as processing speed, power consumption, hardware area, etc.) than is currently provided in the given architectural model. GME 220 may, for instance, receive and/or store information regarding one or more processing devices and/or communication channels that are not present in the given architectural model, and/or one or more architectural models in addition to the given architectural model. GME 220 may use this information when identifying other processing devices and/or communication channels that may be used in lieu of, or in addition to, the processing devices and/or communication channels specified by the given architectural model.

In some implementations, GME 220 may output one or more visual representations of the mapping. One particular visual representation may be block-centric (e.g., the blocks of the functional model may be displayed, with annotations indicating hardware to which the blocks are mapped), while another particular visual representation may be architecture-centric (e.g., representations of the hardware may displayed, with annotations indicating blocks of the functional model that are mapped to the hardware). In some implementations, GME 220 may provide for display of one of these representations, while in some implementations, GME 220 may provide for display of both of these representations simultaneously.

Figure 7A:
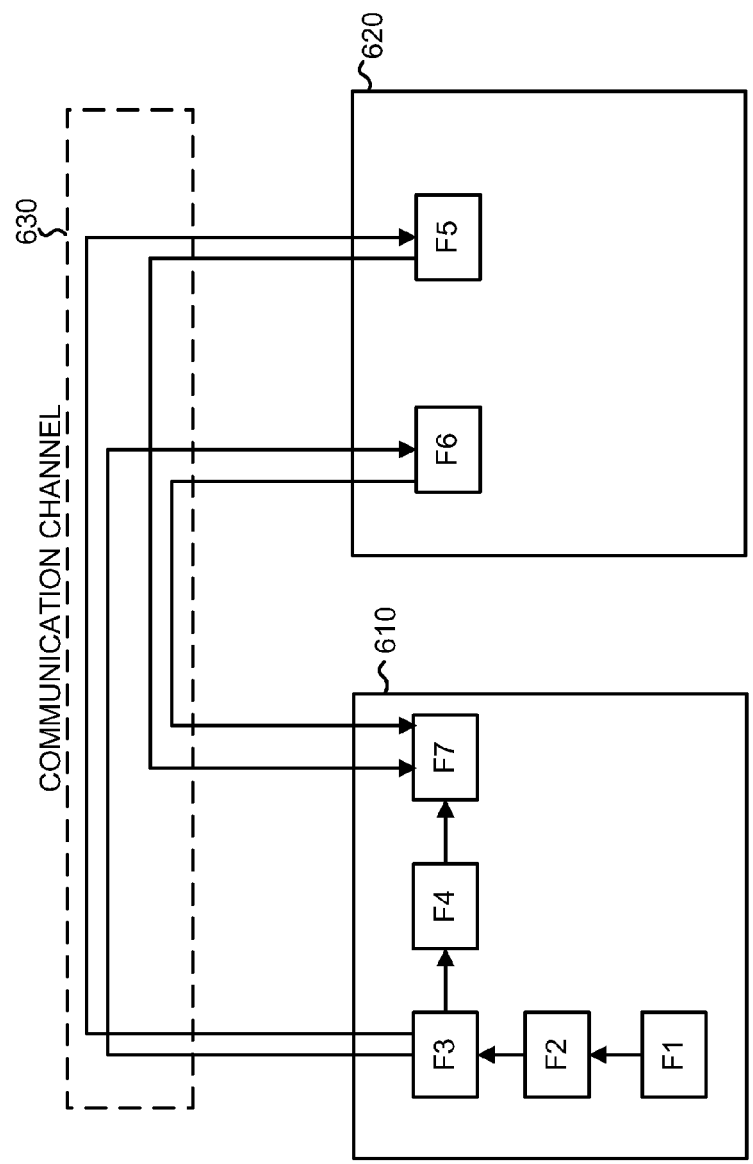
FIGS. 7A and 7B illustrate examples of outputting information regarding a mapping of a functional model to an architectural model.

FIG. 7A illustrates an example architecture-centric view of a mapping of functional model 500 to architectural model 600-1. In this example, assume that processing device 610 is connected to an input sensor from which block F1 receives data. From functional model 500, assume that functional blocks F1, F2, and F3 must execute sequentially with respect to one another. That is, block F2 operates on data output from block F1 and block F3 operates on data output from block F2. Further assume that blocks F4, F5, and F6 depend on the output of block F3, and block F7 receives the outputs of each of blocks F4, F5, and F6. In FIG. 7A, blocks F1, F2, F3, F4, and F7 may be associated with processing device 610, and blocks F5 and F6 may be associated with processing device 620. Communications between the functional blocks in processing devices 610 and 620 are shown as lines through communication channel 630. In operation, a complete execution period of model 500 may include receiving data at processing device 610, sequentially executing blocks F1, F2, and F3 by processing device 610, transmitting output data from block F3 over communication channel 630 to processing device 620, executing block F4 by processing device 610 while simultaneously executing blocks F5 and F6 by processing device 620, transmitting data over communication channel 630 back to block F7, and executing block F7 by processing device 610.

In some implementations, annotations indicating functional blocks that are mapped to hardware may be active links. An active link may be activated by a user interaction (e.g., a key stroke, a mouse click, a touchpad gesture, etc.) and, in response to the activation, GME 220 may navigate the user to the corresponding functional block in the functional model.

Figure 7B:
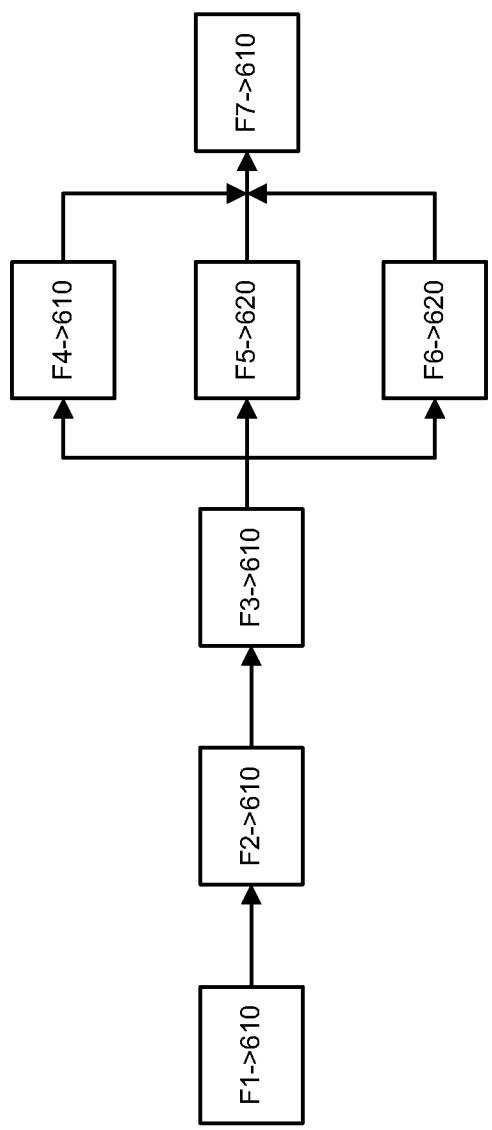

FIG. 7B illustrates an example block-centric view of a mapping of functional model 500 to architectural model 600-1. In some implementations, FIG. 7B may be an example of another way of representing the mapping shown in FIG. 7A. In FIG. 7B, the functional model may be displayed, with annotations indicating hardware to which the functional blocks are mapped. For example, in FIG. 7B, blocks F1-F4 and F7 may include an annotation indicating that these blocks are mapped to processing device 610, while blocks F5 and F6 may include an annotation indicating that these blocks are mapped to processing device 620.

In some implementations, annotations indicating hardware to which the functional blocks are mapped may be active links. An active link may be activated by a user interaction (e.g., a key stroke, a mouse click, a touchpad gesture, etc.) and, in response to the activation, GME 220 may navigate the user to the corresponding hardware (e.g., a processing device) in the architectural model.

In some implementations, GME 220 may perform multiple mappings at block 430. For example, GME 220 may identify multiple different possible ways of mapping the functional model to the architectural model. Additionally, or alternatively, GME 220 may receive information (e.g., from a user) specifying multiple mappings of the functional model to the architectural model. GME 220 may provide for the display of graphical representations (e.g., icons, text, etc.) of the multiple mappings, and may allow for the selection of a particular mapping based on a selection (e.g., a click, a double click, etc.) of the graphical representation of the particular mapping.

Returning to FIG. 4, process 400 may include generating a functional effect based on the functional model, the mapping, and the architectural model (block 440). For example, GME 220 may generate the functional effect based on a command (e.g., a single command, such as one click of a mouse, one key press, one double-click of a mouse, etc.).

An example of functional effect generation may include determining communication delay between two connected blocks of the functional model, which are mapped to different physical devices, based on the configuration of the physical devices, such as execution mode of the physical devices. For instance, assuming that one of the physical devices is configured as a delayed coprocessor, delay may be associated with data transferred from this device to the other physical device. In some implementations, GME 220 may use the determined communication delay in the mapped functional model. Another example of functional effect generation may include determining an order of execution of blocks, in the functional model, which are mapped to different physical devices (e.g., different CPUs) based on scheduler properties of these processing devices.

The functional effect may generated by, for example, generating computer code. The generated computer code may include, software code (e.g., C code, C++ code, Java code, etc.) and/or hardware code (e.g., very high speed integrated circuit hardware description language (VHDL) code, Verilog, etc.). The generated computer code may include non-executable code (e.g., code that cannot be executed without further processing, such as un-compiled C code), executable code (e.g., code that can be executed without further processing, such as compiled C code, Java bytecode, object files combined together with linker directives, makefiles, throwaway source code, etc.). The generated computer code may include text files that can be directly executed in conjunction with other executable files (e.g., Python text files, dynamic linked library (DLL) files with text-based combining (e.g., an XML file that describes linkage of modules), etc.).

The generation of the computer code may be based on the command mentioned above (e.g., a single command, such as one click of a mouse, one key press, one double-click of a mouse, etc.). In addition to generated computer code, GME 220 may, in response to the command, generate configuration code (e.g., makefiles, project files, interface code, etc.), which may be used to transform the generated computer code into executable code. Additionally, or alternative, GME 220 may, in response to the command, trigger all necessary actions to obtain the executable code (e.g., binaries), such as compilation, linking object files, and/or synthesizing bitstream, and may also output the executable code to the particular target platform for execution by the target platform. In some implementations, the target platform may execute the code, while a host application is connected to the executing application on the target platform. For example, a user may initiate application execution by activating a user interface element associated with GME 220, such as a menu, button, command line action, etc. In response, GME 220 may generate computer code (e.g., executable code) for a functional model based on mapping information, output this generated code to a target platform, and set up a communication between a host application and a target application. After initiating this process (e.g., via a 'one-click build' user action), the user may only be required to confirm actions such as, for example, overwriting existing code, deleting directory structures, resolving choice in communication channels, etc.

As mentioned above, the computer generated code may include device driver code, references to device driver code, device driver libraries, and/or references to device driver libraries. That is, when generating the code, GME 220 may generate code based on logic of the functional model and may further generate the code based on processing device information (e.g., device driver code, references to device driver code, device driver libraries, and/or references to device driver libraries). Thus, the generated code may include code based on the functional model and code based on the architectural mode (e.g., device driver code in line with, and/or interspersed with, code based on the functional model). GME 220 may utilize the information received at block 420 in order to determine which device driver code is necessary for the mapped functional model and the associated architectural model, and how to incorporate the device driver code into the generated code.

Process 400 may include simulating the generated functional effect (block 450). For instance, GME 220 may use any type of simulation technique, such as real-time simulation (e.g., hardware in the loop) and/or non-real-time simulation techniques (e.g., software in the loop, processor in the loop, interpretive, accelerated simulation through code generation (e.g., through partial code generation), multi-core accelerated simulation, distributed simulation, etc.), to simulate the execution of the code on the target hardware. When simulating the execution of the code, GME 220 may utilize properties associated with the target hardware (e.g., properties specified in the information received at block 420). As mentioned above, these properties may include processor speed, communication delays, scheduler, etc.

Simulating the execution of the code may rely on execution semantics based on the functional model. For example, the execution of generated code for a functional model that is at least partially implemented as a time-based block diagram may be simulated as a time-based block diagram. As another example, the execution of generated code for a functional model that is at least partially implemented as a discrete-event system may be simulated as a discrete-event system. As an example of different execution semantics, the execution of generated code for a functional model that is at least partially implemented as a time-based block diagram may be simulated as a discrete-event system. Further execution semantics include differential equations, difference equations, discrete events, communicating processes, process networks, Petri nets, synchronous equations, transition systems, control flow, data flow, etc.

In some implementations, GME 220 may perform multiple mappings of the functional model to one or more architectural models. Part of the results of simulating the generated code for multiple such mappings may be displayed in a shared visualization such as a plot, a graph, a table, etc. For example, the generated code for two different mappings of a functional model to an architectural model may be simulated and the traces of a variable (values over time) in the functional model may be displayed in a graph for both mappings (e.g., by color coding the different traces).

As a result of performing the simulation, GME 220 may allow identification of various expected performance metrics associated with the execution of the generated code. For example, the simulation may make possible the identification of execution times, memory usage, debugging information (e.g., whether values input and/or output at various stages during execution match expected values), etc. Simulating the execution of the generated code allows various benefits. For instance, a user may use simulation information to determine whether a particular mapping and/or a particular architecture meets the user's goals, without necessitating that the actual hardware indicated in the architectural model is present. A user may, for example, decide that a particular mapping is unsatisfactory, view details of the simulation, and may specify a new or modified mapping. GME 220 may, at this point, repeat steps 430-450 until the user is satisfied.

Process 400 may further include outputting the functional effect for execution of the functional model on target hardware (block 460). For example, GME 220 may output the generated code to, for example, a file or set of files. Additionally, or alternatively, GME 220 may output the generated code to one or more external devices (e.g., one or more devices that includes the target hardware). In some implementations, GME 220 may compile the generated code, in the instances where the generated code includes un-compiled code. In some implementations, GME 220 may output (e.g., display via a user interface) information corresponding one or more functional effects to one or more portions of the functional model, according to the mapping. For example, GME 220 may display communication delay, processing speed, scheduler information, and/or any other type of information associated with one or more portions of the functional model, according to the mapping. In some implementations, this functional effect information may be obtained as a result of the generation of the functional effect (e.g., at block 440), and/or the simulation performed at block 450. Thus, in some implementations, output of functional effects may modify a manner in which a functional model, as created by a user of GME 220, is displayed in a user interface associated with GME 220. Such modifications may take place directly in the same user interface of GME 220 (e.g., a user interface of a single application, via which the user created and/or edited the functional model, without invoking a separate application to display the modifications).

CONCLUSION

The foregoing description of implementations provides illustration and description, but is not intended to be exhaustive or to limit the invention to the precise form disclosed. Modifications and variations are possible in light of the above teachings or may be acquired from practice of the invention.

For example, while a series of acts has been described with regard to FIG. 4, the order of the acts may be modified in other implementations. Further, non-dependent acts may be performed in parallel. Also, the term "user," as used herein, is intended to be broadly interpreted to include, for example, a workstation or a user of a workstation.

It will be apparent that embodiments, as described herein, may be implemented in many different forms of software, firmware, wetware, and/or hardware in the implementations illustrated in the figures. The actual software code or specialized control hardware used to implement embodiments described herein is not limiting of the invention.

Further, certain portions of the invention may be implemented as "logic" that performs one or more functions. This logic may include hardware, such as an application specific integrated circuit or a field programmable gate array, software, or a combination of hardware and software.

It should be noted that one or more computer-readable media may store computer-executable instructions that when executed by a processing unit, such as processing unit 220, may perform various acts associated with one or more embodiments of the invention. The computer-readable media may be volatile or non-volatile and may include, for example, flash memories, removable disks, non-removable disks, and so on.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A computer-implemented method comprising:
receiving information regarding a plurality of physical devices,
the receiving the information regarding the plurality of physical devices being performed by the computer;
receiving information regarding a set of functional blocks associated with a functional model,
the receiving the information regarding the set of functional blocks being performed by the computer;
receiving mapping information that indicates a mapping of the set of functional blocks to one or more physical devices of the plurality of physical devices,
the receiving the mapping information being performed by the computer; and
generating at least one functional effect to be used in the functional model based on the set of functional blocks, the mapping information, and the information regarding the one or more physical devices,
the at least one functional effect modifying behavior of the functional model by reconfiguring at least a portion of the functional model based on the at least one functional effect,
the at least the portion of the functional model being reconfigured by at least one of:
reconfiguring fixed-point data types based on the at least one functional effect, or
reconfiguring closed-loop gains based on the at least one functional effect,
the generating being performed by the computer.

2. The computer-implemented method of claim 1, where the information regarding the plurality of physical devices includes:
information regarding one or more communication pathways between a first one of the plurality of physical devices and a second one of the plurality of physical devices,
where the at least one functional effect is further based on the information regarding the one or more communication pathways.

3. The computer-implemented method of claim 1, where the information regarding the plurality of physical devices includes:
information regarding a device driver associated with at least a particular one of the plurality of physical devices,
where the at least one functional effect is further based on the information regarding the device driver.

4. The computer-implemented method of claim 1, where the functional effect is based on at least one of:
a delay time associated with at least one of the one or more physical devices,
a processing speed associated with at least one of the one or more physical devices,
a delay time associated with a communication pathway between at least a first one of the one or more physical devices and a second one of the one or more physical devices,
a delay time associated with a device driver associated with at least a particular one of the plurality of physical devices, or
quantization and saturation of values associated with a device driver associated with at least a particular one of the plurality of physical devices.

5. The computer-implemented method of claim 1, where the plurality of physical devices includes at least two of:
- a central processing unit,
- a digital signal processing unit,
- a micro-controller processing unit,
- a floating point unit,
- a graphics processing unit,
- a field programmable gate array (FPGA),
- an application-specific integrated circuit (ASIC), or
- a particular core of a multi-core processing unit.

6. The computer-implemented method of claim 5, where the plurality of physical devices includes at least:
- two central processing units,
- two digital signal processing units,
- two micro-controller processing units,
- two floating point units,
- two graphics processing units,
- two FPGAs,
- two ASICs, or
- two cores of the multi-core processing unit.

7. The computer-implemented method of claim 1, where the plurality of physical devices is a first plurality of physical devices, where the mapping information is first mapping information that indicates a first mapping,
the computer-implemented method further comprising:
receiving second mapping information that indicates a second mapping between the set of functional blocks to one or more physical devices of a second plurality of physical devices,
the first mapping being different from the second mapping, and
the first plurality of physical devices being different from the second plurality of physical devices.

8. The computer-implemented method of claim 1, further comprising:
simulating, based on the at least one functional effect, the set of functional blocks associated with the functional model.

9. The computer-implemented method of claim 8, further comprising:
outputting a result of the simulating, where the outputted result includes at least one of:
an execution time associated with some or all of performing the simulating,
an input that is used when performing some or all of the simulating, or
an output that is generated as a result of performing some or all of the simulating.

10. The computer-implemented method of claim 1, where generating the at least one functional effect includes:
generating code based on:
the set of functional blocks,
the mapping information, and
the information regarding the one or more physical devices.

11. The computer-implemented method of claim 10, further comprising:
receiving, by a computing device that includes the one or more physical devices, information based on the generated code; and
executing, by the one or more physical devices of the computing device, at least a portion of the information based on the generated code.

12. The computer-implemented method of claim 10, where generating the code is based on information regarding a communication pathway between a first physical device, of the one or more physical devices, and a second physical device, of the one or more physical devices.

13. The computer-implemented method of claim 10, where information regarding a particular physical device, of the one or more physical devices, includes information identifying a type of physical device associated with the particular physical device,
where generating the code comprises:
identifying a code language associated with the type of physical device associated with the particular physical device,
where the generated code includes code associated with the identified code language.

14. The computer-implemented method of claim 13, where the particular physical device is a first physical device, where the type of physical device associated with the first physical device is a first type of physical device, where the code language is a first code language,
where the information regarding the plurality of physical devices includes information identifying a second type of physical device associated with a second physical device, where the second type of physical device is different from the first type of physical device,
where generating the code further comprises:
identifying a second code language associated with the second type of physical device,
where the generated code further includes code associated with the identified second code language.

15. The computer-implemented method of claim 10, where the code is generated based on a received single command.

16. The computer-implemented method of claim 1, where the mapping information is first mapping information, where the mapping between the set of functional blocks to the one or more physical devices is a first mapping,
the computer-implemented method further comprising:
receiving second mapping information that indicates a second mapping between the set of functional blocks to one or more physical devices of the plurality of physical devices,
the first mapping being different from the second mapping.

17. The computer-implemented method of claim 1, where the at least one functional effect includes a delay incurred based on communication between the one or more physical devices,
where the at least the portion of the functional model is reconfigured by readjusting the closed-loop gains based on the delay.

18. The computer-implemented method of claim 1, where the at least the portion of the functional model is reconfigured by reconfiguring the fixed-point data types to make use of word-sizes on target hardware based on the at least one functional effect.

19. One or more non-transitory computer-readable media, comprising:
one or more instructions that, when executed by a processor of a device, cause the processor to:
receive information regarding a plurality of physical devices;
receive information regarding a set of functional blocks associated with a functional model;
receive mapping information that indicates a mapping of the set of functional blocks to one or more physical devices of the plurality of physical devices; and generate code to be used in the functional model based on the set of functional blocks, the mapping information, and the information regarding the one or more physical devices,
  the code modifying behavior of the functional model by reconfiguring at least a portion of the functional model based on the code,
  the at least the portion of the functional model being reconfigured including:
    fixed-point data types being reconfigured based on the code, or
    closed-loop gains being reconfigured based on the code.

20. The one or more non-transitory computer-readable media of claim 19, where the generated code include device driver information, associated with the one or more physical devices, included in the information regarding the one or more physical devices.

21. A device, comprising:
  a processor to:
    receive information regarding a plurality of physical devices;
    receive information regarding a set of functional blocks associated with a functional model;
    receive mapping information that indicates a mapping of the set of functional blocks to one or more physical devices of the plurality of physical devices; and
    generate at least one functional effect to be used in the functional model based on the set of functional blocks, the mapping information, and the information regarding the one or more physical devices,
      the at least one functional effect modifying behavior of the functional model by reconfiguring at least a portion of the functional model based on the at least one functional effect,
      the at least the portion of the functional model being reconfigured by at least one of:
        reconfiguring fixed-point data types based on the at least one functional effect, or
        reconfiguring closed-loop gains based on the at least one functional effect.

* * * * *